US011362195B2

(12) United States Patent
Chen et al.

(10) Patent No.: US 11,362,195 B2
(45) Date of Patent: Jun. 14, 2022

(54) SEMICONDUCTOR DEVICE AND A METHOD FOR FORMING A SEMICONDUCTOR DEVICE

(71) Applicant: IMEC VZW, Leuven (BE)

(72) Inventors: Shih-Hung Chen, Heverlee (BE); Dimitri Linten, Boortmeerbeek (BE)

(73) Assignee: Imec VZW, Leuven (BE)

( * ) Notice: Subject to any disclaimer, the term of this patent is extended or adjusted under 35 U.S.C. 154(b) by 181 days.

(21) Appl. No.: 16/723,742

(22) Filed: Dec. 20, 2019

(65) Prior Publication Data
US 2020/0212199 A1 Jul. 2, 2020

(30) Foreign Application Priority Data
Dec. 28, 2018 (EP) ..................................... 18248199

(51) Int. Cl.
| | |
|---|---|
| H01L 29/78 | (2006.01) |
| H01L 29/66 | (2006.01) |
| H01L 21/8234 | (2006.01) |
| H01L 27/02 | (2006.01) |
| H01L 27/088 | (2006.01) |

(52) U.S. Cl.
CPC .................. H01L 29/66545 (2013.01); H01L 21/823431 (2013.01); H01L 21/823475 (2013.01); H01L 27/0288 (2013.01); H01L 27/0886 (2013.01); H01L 29/66795 (2013.01); H01L 29/785 (2013.01)

(58) Field of Classification Search
None
See application file for complete search history.

(56) References Cited

U.S. PATENT DOCUMENTS

| | | |
|---|---|---|
| 9,368,484 B1 | 6/2016 | Chen et al. |
| 2003/0052367 A1 | 3/2003 | Lin |
| 2014/0306296 A1 | 10/2014 | Jeon et al. |
| 2015/0008476 A1 | 1/2015 | Shrivastava et al. |
| 2016/0064373 A1 | 3/2016 | Narita |
| 2016/0181238 A1 | 6/2016 | Su |

(Continued)

OTHER PUBLICATIONS

European Search Report, European Patent Application No. 18248199. 4, dated Jun. 28, 2019, 5 pages.

*Primary Examiner* — Joseph C. Nicely
*Assistant Examiner* — Lamont B Koo
(74) *Attorney, Agent, or Firm* — McDonnell Boehnen Hulbert & Berghoff LLP (57) ABSTRACT

A semiconductor device and a method for forming such are provided, the device including: a substrate, a plurality of parallel active semiconductor patterns that extend through a drain-side region and a source-side region, a metal drain contact in the drain-side region, an active gate pattern, a first dummy gate pattern, and a second dummy gate pattern that all extend across the active semiconductor patterns, and a metal interconnect structure located in a region between the first and the second dummy gate patterns. The active semiconductor patterns are doped with a dopant in portions exposed by the dummy gates in dummy gate regions that include the gate cut regions of the first and second dummy gate patterns. The metal interconnect structure connects each of a second subset of the active semiconductor patterns to a respective at least one of a first subset of the active semiconductor patterns.

20 Claims, 8 Drawing Sheets

(56) References Cited

U.S. PATENT DOCUMENTS

2017/0098645 A1    4/2017   Su et al.
2017/0194487 A1*   7/2017   Chen .................. H01L 29/0869
2018/0151554 A1    5/2018   Peng et al.

* cited by examiner

SEMICONDUCTOR DEVICE AND A METHOD FOR FORMING A SEMICONDUCTOR DEVICE

CROSS-REFERENCE TO RELATED APPLICATIONS

The present application is a non-provisional patent application claiming priority to European Patent Application No. EP 18248199.4, filed Dec. 28, 2018, the contents of which are hereby incorporated by reference.

FIELD OF THE DISCLOSURE

The present disclosure relates to a method for forming a semiconductor device. The present disclosure further relates to a semiconductor device.

BACKGROUND

Electrostatic discharge is a major reliability challenge in state of the art integrated circuit design. To reduce the risk for damage due to ESD events ESD protection devices may be implemented, for instance in I/O interface circuits of integrated circuits.

One technique for protecting devices against ESD events is to provide transistors with a drain ballast resistor. For instance, in output drivers comprising FinFETs (FF) or gate-all-around (GAA) nanowire FETs (NWFETs), provision of a drain ballast resistor may be considered as a design rule. A drain ballast resistor may counteract local filamentation which can induce a non-uniform current distribution along the width direction of the transistor channel, and eventually result in reduced ESD robustness.

In sub-micron CMOS technologies drain ballast resistors have been implemented using silicide blocking. However, silicide blocking may be incompatible for FFs and GAA NWFETs since such device processing typically involve forming the local interconnect silicide after defining the diffusion regions.

SUMMARY

There is a need for novel drain ballast approaches. An objective is to provide a semiconductor device comprising a drain-side ballast region and a method for forming such a semiconductor device, which are compatible with the design and fabrication methods for modern FET devices, such as FFs and GAA NWFETs. Further and/or alternative objectives may be understood from the following.

According to a first aspect there is provided a method for forming a semiconductor device, the method comprising: (i) forming on a substrate a set of parallel gate patterns across a plurality of parallel active semiconductor patterns extending along the substrate, the set of gate patterns comprising: an active gate pattern formed between a drain-side region and a source-side region, and a first and a second dummy gate pattern, (ii) forming a metal drain contact in the drain-side region, wherein the first and second dummy gate patterns are formed in a ballast region located in the drain-side region between the metal drain contact and the active gate pattern, wherein the first dummy gate pattern comprises a number of first dummy gate regions defining a respective dummy gate and a number of first gate cut regions alternating the first dummy gate regions and in which a dummy gate is absent, wherein each first dummy gate region extends across a respective first subset of the active semiconductor patterns and each first gate cut region extends across a respective second subset of the active semiconductor patterns, and wherein the second dummy gate pattern is formed between the first dummy gate pattern and the active gate pattern and comprises a number of second dummy gate regions defining a respective dummy gate and a number of second gate cut regions alternating the second dummy gate regions and in which a dummy gate is absent, wherein each second dummy gate region extends across a respective one of the second subsets of the active semiconductor patterns and each second gate cut region extends across a respective one of the first subsets of the active semiconductor patterns, wherein the active semiconductor patterns are un-doped or doped with a first type of dopant and the method further comprises doping the active semiconductor patterns in the drain-side region with a second type of dopant while using the first and second dummy gate patterns as a mask to counteract doping of the active semiconductor patterns with the second type of dopant in the dummy gate regions, and (iii) forming a metal interconnect structure connecting each of the active semiconductor patterns of the second subset to at least one of the active semiconductor patterns of the first subset in a region between the first and the second dummy gate patterns According to a second aspect there is provided a semiconductor device comprising: (i) a substrate; (ii) a plurality of parallel active semiconductor patterns extending along the substrate through a drain-side region and a source-side region; (iii) a set of parallel gate patterns extending across the active semiconductor patterns, the set of gate patterns comprising an active gate pattern and a first and a second dummy gate pattern, wherein the active gate pattern is arranged between the drain-side region and the source-side region and the first and second dummy gate patterns are arranged in a ballast region located in the drain-side region between the metal drain contact and the active gate pattern, wherein the first dummy gate pattern defines a number of first dummy gate regions comprising a respective dummy gate and a number of first gate cut regions alternating the first dummy gate regions and in which a dummy gate is absent, wherein each first dummy gate region extends across a respective first subset of the active semiconductor patterns and each first cut region extends across a respective second subset of the active semiconductor patterns, and wherein the second dummy gate pattern is arranged between the first dummy gate pattern and the active gate pattern and defines a number of second dummy gate regions comprising a respective dummy gate and a number of second gate cut regions alternating the second dummy gate regions and in which a dummy gate is absent, wherein each second dummy gate region extends across a respective one of the second subsets of the active semiconductor patterns and each second cut region extends across a respective one of the first subsets of the active semiconductor patterns, wherein the active semiconductor patterns are un-doped or doped with a first type of dopants in portions covered by the dummy gates in the dummy gate regions and doped with a second type of dopant in portions exposed by the dummy gates in the dummy gate regions, the exposed regions comprising the gate cut regions of the first and second dummy gate patterns, the device further comprising (iv) a metal interconnect structure connecting each of the active semiconductor patterns of the second subset to at least one of the active semiconductor patterns of the first subset in a region between the first and the second dummy gate patterns.

The first and second aspects provide a semiconductor device with ESD protection in the form of a drain-side ballast region located between the drain contact and the active gate pattern. The ballast resistance is formed by extending the drain-side (diffusion) region to encompass two or more dummy gate tracks.

In modern device fabrication, the source/drain doping, defining the source/drain diffusion regions, are typically formed after forming the gate patterns. The gate structures of the gate patterns may thus act as doping masks, counteracting doping in active semiconductor pattern portions covered by the gate structures. The embodiments described herein make use of this approach by providing the first and second dummy gate patterns with respective gate cut regions alternating sets of dummy gate regions. The dummy gate patterns will accordingly allow doping of active semiconductor pattern portions in the gate cut regions and counteract doping in active semiconductor pattern portions in the dummy gate regions. Accordingly, the first and second subsets of active semiconductor patterns may (in the ballast region) comprise portions doped with the second type of dopant (forming drain diffusion portions) which are interrupted by un-doped or oppositely doped portions covered by dummy gates of the first and second dummy gate patterns.

As the dummy gates are electrically inactive, i.e. not supplied with any voltages in use of the device, active semiconductor pattern portions covered by the dummy gates may form high-resistance portions, counteracting a current flow under the dummy gates. Meanwhile, the metal interconnect structure provides a low-resistance path from the metal drain contact towards the active gate pattern: A current propagating along an active semiconductor pattern (e.g. of the second subset) may circumvent a high-resistance portion under a dummy gate by flowing to one of the parallel active semiconductor patterns (e.g. of the first subset) via the metal interconnect structure. This "lane switching" provides a circuitous current path which may contribute both to the driving capability and the ballast resistance by elongating the current path between the drain and the active gate pattern.

As may be appreciated, a ballast may thus be provided by addition of an appropriately designed gate cut mask and addition of the metal interconnect structure.

An "active semiconductor pattern," as used herein, means a semiconductor pattern formed on a substrate and including doped and/or un-doped portions. Such a semiconductor pattern may be elongated along a longitudinal direction, with the doped and/or un-doped portions distributed along the longitudinal direction of the semiconductor pattern. Each semiconductor pattern may be formed along a respective active track, i.e. a straight-line geometrical track extending in a first horizontal direction. Each active semiconductor pattern can include an elongated semiconductor body protruding above the substrate. Each semiconductor pattern may comprise a semiconductor fin, or a horizontally oriented nanowire or nanosheet.

A "gate pattern," as used herein, means a pattern of one or more gate elements which are formed along a common gate track. As used herein, the term "gate track" refers to a straight-line or substantially straight-line geometrical track extending in a second horizontal direction along the substrate, transverse to the first horizontal direction.

With reference to the method of the first aspect, the active gate pattern may comprise one or more gate elements in the form of one or more active metal gate electrodes. An active metal gate electrode refers to a metal gate electrode which in use of the device is an electrically active gate, i.e. configured to be supplied with a gate voltage via one or more gate contacts of the device. Correspondingly, a dummy gate pattern may comprise one or more dummy gate elements in the form of one or more dummy metal gate electrodes which is electrically inactive during use of the device, i.e. not supplied with any controlled gate voltage during use of the device. Still with reference to the method of the first aspect, the active gate pattern may alternatively comprise one or more gate elements in the form of one or more active sacrificial gate elements. An active sacrificial gate element refers to a sacrificial gate element which during fabrication serves as a placeholder for, and which may be replaced with, a final active metal gate electrode (i.e. an active replacement metal gate electrode), subsequent to the doping of the active semiconductor patterns with the second type of dopant. Correspondingly, a dummy gate pattern may include one or more dummy gate elements in the form of one or more dummy sacrificial gate elements. A dummy sacrificial gate element refers to a sacrificial gate element which during fabrication serves as a placeholder for, and which may be replaced with, a final dummy metal gate electrode (i.e. a dummy replacement metal gate electrode), subsequent to the doping of the active semiconductor patterns with the second type of dopant.

With reference to the device of the second aspect, the active gate pattern may comprise one or more gate elements in the form of one or more active metal gate electrodes. An active metal gate electrode refers to a metal gate electrode which is an electrically active gate during use of the device, i.e. configured to be supplied with a gate voltage via one or more gate contacts of the device. Correspondingly, a dummy gate pattern may comprise one or more gate elements in the form of one or more dummy metal gate electrodes which is electrically inactive during used of the device, i.e. not supplied with any controlled gate voltage during use of the device.

In any case, in the first and second dummy gate patterns the dummy gates/dummy gate elements are located in the dummy gate regions, and are separated by gaps or cuts located in the gate cut regions, which regions are formed along a common first and second dummy gate track, respectively. This may apply correspondingly to any further dummy gate pattern referred to herein.

The first metal interconnect structure may connect each of the active semiconductor patterns of the second subset to each of the active semiconductor patterns of the first subset. This may contribute to balancing the current densities between the active semiconductor patterns and thus contribute to the ESD protection reliability.

The metal interconnect structure may comprise a set of metal contacts on the active semiconductor patterns (portions) in the region between the first and the second dummy gate patterns, and a metal interconnect layer on the metal contacts. The metal interconnect structure may accordingly provide a circuitous current path comprising both vertical path portions (through the contacts) and horizontal path portions (through the metal interconnect layer). The length of the circuitous path may accordingly be conveniently designed via e.g. a vertical height of the contacts.

The metal interconnect layer forms a continuous metal interconnect layer abutting each of the metal contacts, which may facilitate the fabrication process. However, it is also possible to form the metal interconnect layer in a number of separate metal layer parts, each formed on a respective subset of the vertical metal contacts. This may provide an increased design flexibility of the ballast design.

A second metal interconnect structure may be provided for connecting each of the active semiconductor patterns of the first subset to at least one of the active semiconductor patterns of the second subset in a region between the second dummy gate pattern and the active gate pattern. This enables a further "lane switching" currents propagating along the active semiconductor patterns, for instance to circumvent a further high-resistance portion under a dummy gate of a further dummy gate pattern. Additionally or alternatively, a second metal interconnect structure may allow using the active semiconductor patterns of both the first and second subsets as active transistor channels under the active pattern.

The second metal interconnect structure may comprise a set of metal contacts on the active semiconductor patterns (portions) in the region between the second dummy gate pattern and the active gate pattern, and a metal interconnect layer on the metal contacts.

The metal interconnect layer forms a continuous metal interconnect layer abutting each of the metal contacts, which may facilitate the fabrication process. However, it is also possible to form the metal interconnect layer in a number of separate metal layer parts, each formed on a respective subset of the vertical metal contacts. This may provide an increased design flexibility of the ballast design.

The second metal interconnect structure may connect each of the active semiconductor patterns of the first subset to each of the active semiconductor patterns of the second subset. This may contribute to balancing the current densities between the active semiconductor patterns and thus contribute to the ESD protection reliability.

The ballast region may be further extended to encompass three dummy gate tracks, or more.

The set of gate patterns may further comprise a third dummy gate pattern formed in the drain-side region, wherein the third dummy gate pattern is formed between the second dummy gate pattern and the active gate pattern, and wherein the third dummy gate pattern comprises a number of third dummy gate regions comprising a respective dummy gate and a number of third gate cut regions in which a dummy gate is absent and alternating the third dummy gate regions, wherein each third dummy gate region extends across a respective one of the first subsets of the active semiconductor patterns and each third gate cut region extends across a respective one of the second subsets of the active semiconductor patterns.

A third metal interconnect structure may be provided for connecting each of the active semiconductor patterns of the second subset to at least one of the active semiconductor patterns of the first subset in a region between the third dummy gate pattern and the active gate pattern.

More generally, the gate tracks may comprise at least one pair of first and second dummy gate tracks as set out above, and a respective pair of first and second metal interconnect structures, the first metal interconnect structure connecting the first and second subsets of active semiconductor patterns in a region between the first and second dummy gate tracks of the pair, and the second metal interconnect structure connecting the first and second subsets of active semiconductor patterns in a region between the second dummy gate track of the pair and a first dummy gate track of a consecutive pair of first and second dummy gate tracks, or in a region between the second dummy gate track of the pair and the active gate track if the pair forms a final pair of first and second dummy gate tracks before the active gate track.

Each one of the first subsets of the active semiconductor patterns may comprises one or more active semiconductor patterns and each one of the second subsets of the active semiconductor patterns may comprises one or more active semiconductor patterns. For tightly spaced active semiconductor patterns two or more active semiconductor patterns may be included in the first and second subsets of semiconductor patterns since this may relax the length dimension of the gate cut regions.

The first and second subsets may comprise a same number of active semiconductor patterns to increase the regularity of the device design. However, it is also possible to define the first and second subsets to comprise different numbers of active semiconductor patterns The metal drain contact structure may be connected to drain-side contact portions of the active semiconductor patterns of first subset and/or the second subset, the choice being dependent on along which of the first and the second subsets a gate cut region first appears (as seen in a direction from the drain towards the active gate track). In any case, the first and second dummy gate patterns are formed between the drain-side contact portions and the active gate pattern

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

A method for forming a semiconductor device comprising a ballast region will now be disclosed with reference to FIGS. 1-4. The ballast region is in the illustrated method formed in a drain-side region of the device and may hence be referred to as a "drain-side ballast region", or shorter "drain-ballast region".

The method may be used in "sub-22 nm" CMOS technologies, such as FFs, where the traditional silicide blocking technique may not be available. Hence, in the following it will be assumed that the active semiconductor patterns comprise a plurality of regularly and tightly spaced fin-shaped semiconductor bodies, i.e. "fins". It should however be noted that the method has a more general applicability to other types of active semiconductor patterns, for instance nanowire-shaped semiconductor bodies, nanosheet-shaped semiconductor bodies, or stacked nanowire-/nanosheet-shaped semiconductor bodies (e.g. for GAANWFETs).

Figure 1:
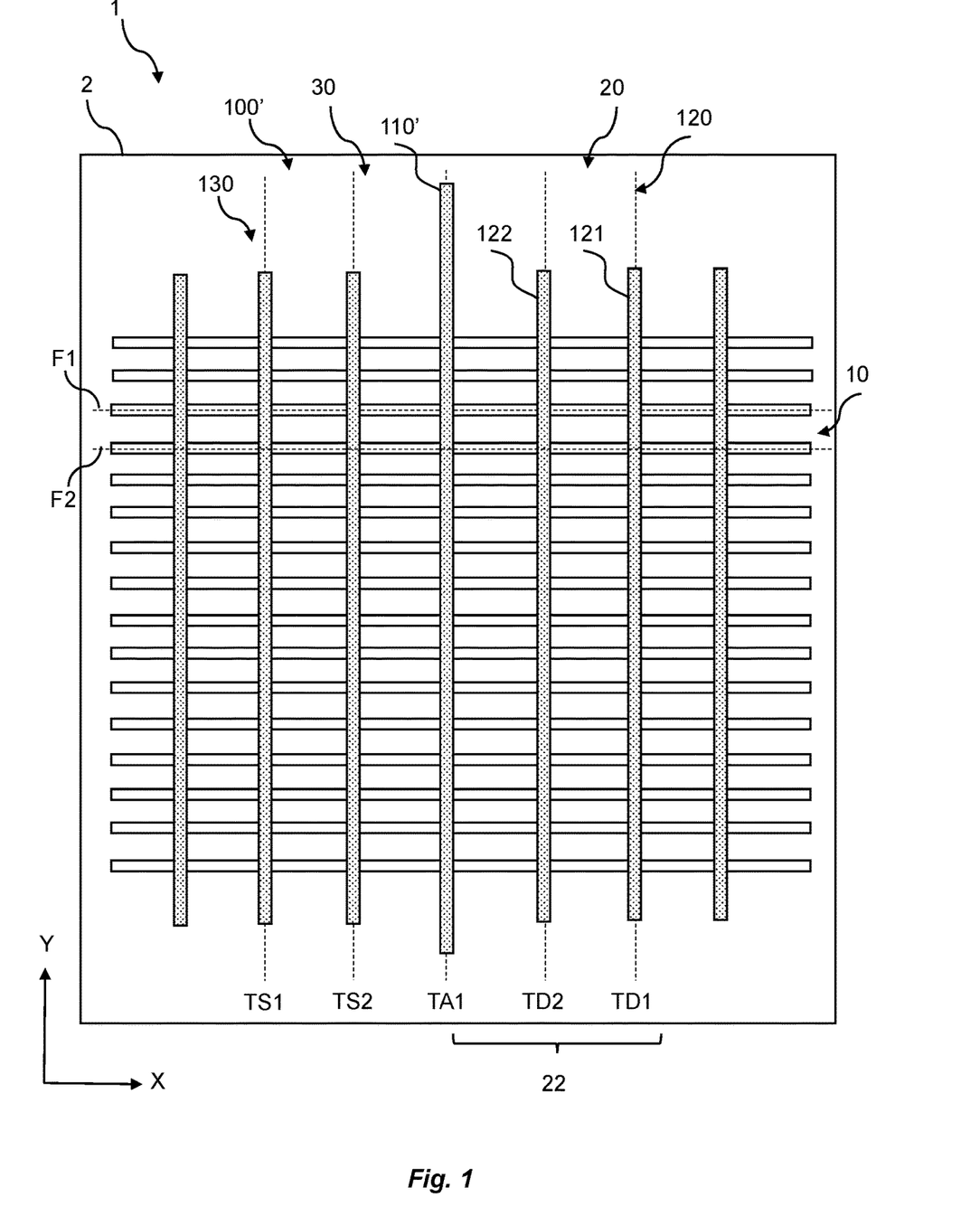
FIG. 1 schematically illustrates a method for forming a semiconductor device comprising a ballast region, according to an example embodiment.

With reference to FIG. 1, there is shown an initial or intermediate device structure 1 comprising a substrate 2, a plurality of mutually parallel active semiconductor patterns in the form of a plurality of fins 10, and a set of mutually parallel preliminary gate patterns 100'.

The substrate 2 may be any conventional substrate, such as a substrate suitable for complementary metal-oxide semiconductor (CMOS) processing. The substrate 2 may for instance be a semiconductor substrate such as a Si substrate, a germanium (Ge) substrate or a silicon-germanium (SiGe) substrate. Other examples include a semiconductor-on-insulator (SOI) type of substrate such as a Si-on-insulator substrate, a Ge-on-insulator substrate or a SiGe-on-insulator substrate.

The fins 10 extend along the substrate 2 in a first horizontal direction X. The fins 10 extend through a drain-side region 20 and a source-side region 30. Each fin 10 extends a long a respective active track or fin track F1, F2, etc. FIG. 1 shows a relatively small number of fins 10. However the method may be applied to a much greater number of parallel fins, such as 500-2800.

The plurality of fins 10 may be formed with a regular spacing, such as on the order of tens of nanometers. The fins 10 may be formed using any conventional fin-formation technique known in the art. For instance, fin-formation may comprise patterning a plurality of trenches in an epitaxial semiconductor layer on the substrate 2, thereby forming parallel fins 10 separated by the trenches. Either single- or multiple-patterning techniques (e.g. self-aligned double or quadruple patterning—SADP or SAQP) may be employed. For example, multiple-patterning techniques may be used for more tightly spaced fin patterns.

Although not shown in FIG. 1, the substrate 2 may be covered by an insulating layer in regions between the fins 10. The insulating layer may embed lower parts of the fins 10. The insulating layer may be formed as a shallow trench isolation (STI) by depositing an insulating layer (for instance an oxide layer such as $SiO_2$ or some other low-k dielectric) in trenches on opposite sides of each fin 10. By way of example, the fin structures 10 may be formed with a height of 10-100 nm above the insulating layer/STI.

The fins 10 may be un-doped, or doped with a first type of dopant to form fins of a first conductivity type. For instance, if an n-type FET device is to be formed, the fins 10 may at this stage be un-doped, or doped with a p-type dopant to form fins of a p-type conductivity. Conversely, if a p-type FET device is to be formed, the fins 10 may at this stage be un-doped, or doped with an n-type dopant to form fins of an n-type conductivity. Fin doping may for instance be achieved by patterning the fins in a pre-doped epitaxial substrate layer, and/or by ion implantation.

The preliminary set of gate patterns 100' extend along the substrate 2 and across the fins 10 in a second horizontal direction Y, transverse to the first horizontal direction X. The set of gate patterns 100' comprises a preliminary active gate pattern 110'. The preliminary active gate pattern 110' is formed between the drain-side region 20 and the source-side region 30. The preliminary active gate pattern 110' is formed to extend along an active gate track TA1. Put differently, the preliminary active gate pattern 110' defines the boundary between the drain-side region 20 and the source-side region 30.

The preliminary set of gate patterns 100' further comprises a number of drain-side dummy gate patterns, at least a first and a second preliminary dummy gate pattern 121, 122. The first and second dummy preliminary gate patterns 121, 122 are located in a drain-side ballast region 22, i.e. region which will comprise a drain ballast in the final device. The first and second preliminary gate patterns 121, 122 are formed to extend along a respective dummy gate track TD1, TD2. As indicated in FIG. 1, the preliminary set of gate patterns 100' may also comprise a preliminary set of source-side dummy gate patterns extending along respective source-side dummy gate tracks such as TS1, TS2. Their presence, or absence, need however not affect any relevant parts of the method which will be described below.

Each one of the preliminary gate patterns 100' may comprise an elongated continuous gate structure/gate line comprising a metal gate electrode/metal gate line, a gate dielectric, and optionally an insulating gate (sidewall) spacer and an insulating gate cap (covering a top surface of the metal gate electrode). The metal gate electrodes may be formed of one or more conventional gate metals, selected in accordance with the intended conductivity type of the device 1. The gate dielectric may comprise one or more oxide and dielectric materials, for instance a stack of a silicon oxide layer and a high-K dielectric. The gate spacers may be of a conventional type such as an oxide spacer or a nitride-comprising spacer. The gate caps may be of a conventional type such as a nitride-comprising cap or a cap of a hard mask material.

Forming preliminary gate patterns comprising metal gate electrodes would correspond to a "gate-first approach" since the metal gate electrodes are in place prior to forming the drain- and source-side diffusions. However, a "gate-last approach" is also possible wherein, instead of metal gate electrodes, each one of the preliminary gate patterns 100' may include an elongated continuous sacrificial gate structure comprising a sacrificial gate element/gate line, for instance of poly-silicon. Such "sacrificial gate patterns" may, similar to the aforementioned example comprise a gate dielectric, and optionally an insulating gate spacer and an insulating gate cap.

In any case, the gate patterns may be formed using a variety of techniques. For instance the method may comprise patterning of a gate material layer (e.g. gate metal(s) or sacrificial gate material) to form the gate patterns, or filing trenches patterned in an insulating layer with the gate material. In either case, the patterning may comprise single- or multiple-patterning techniques (e.g. SADP or SAQP) wherein multiple-patterning techniques may be used for more tightly spaced gate patterns.

Figure 2:
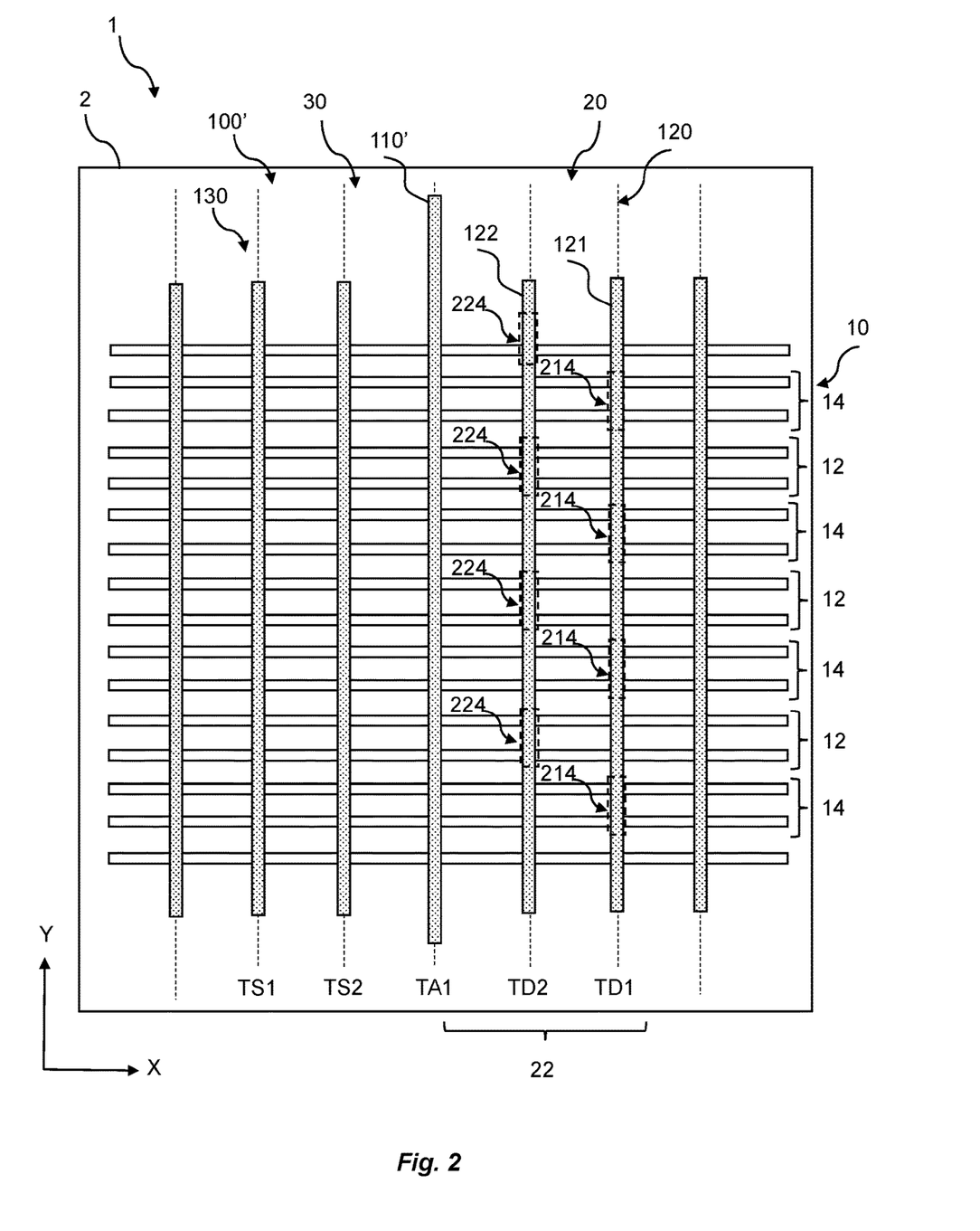
FIG. 2 schematically illustrates a method for forming a semiconductor device comprising a ballast region, according to an example embodiment.

In FIG. 2, a gate cut mask has been formed above the preliminary gate patterns 100'. The gate cut mask is schematically indicated by the dashed boxes 214 distributed with respect to each other along the first dummy gate track TD1 and the dashed boxes 224 distributed with respect to each other along the second dummy gate track TD2. The dashed boxes 214, 224 signify openings in the gate cut mask which will allow the gate structures of the preliminary dummy gate patterns 100' to be cut, using an etching process.

Figure 3:
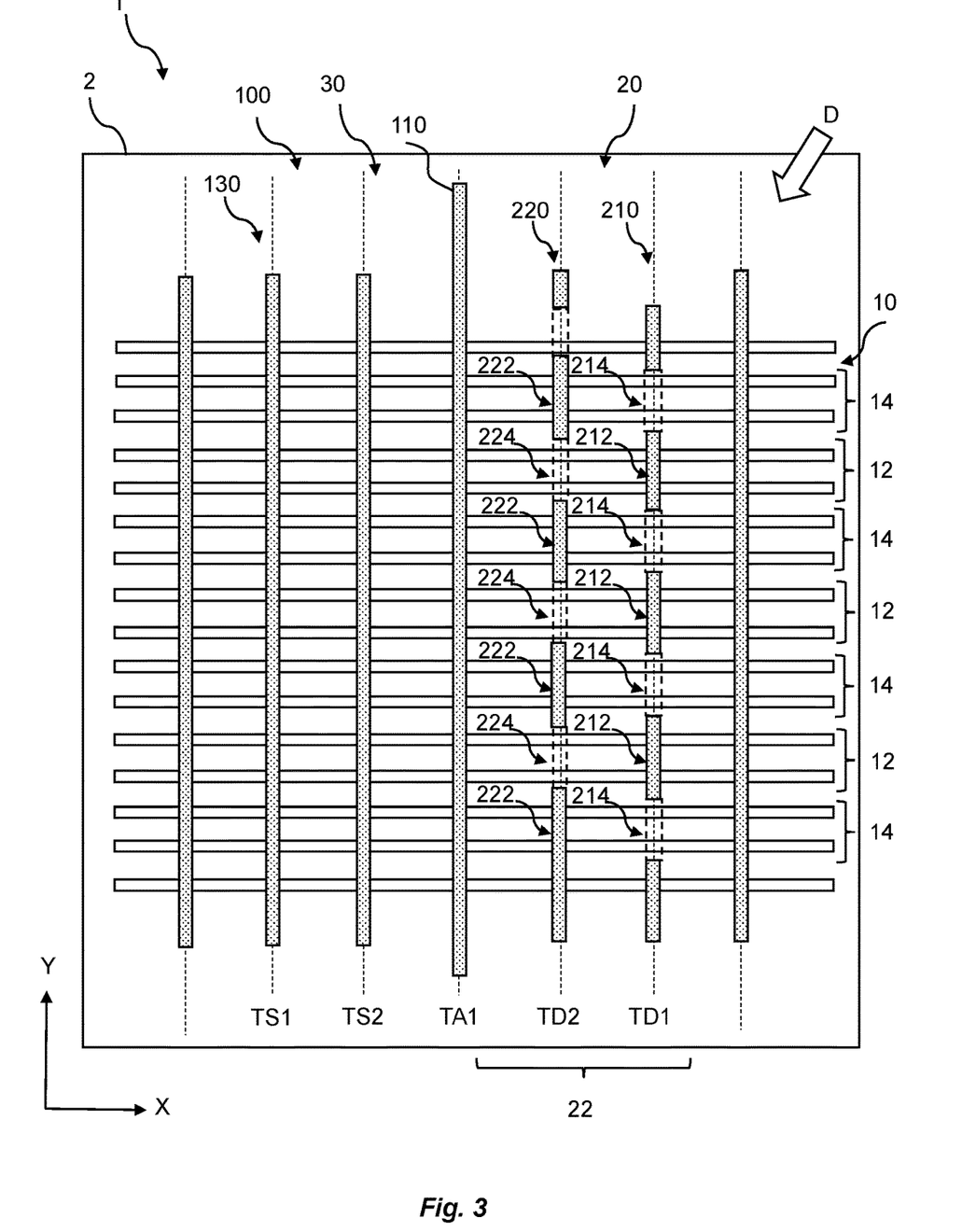
FIG. 3 schematically illustrates a method for forming a semiconductor device comprising a ballast region, according to an example embodiment.

As will be further shown in FIG. 3, the gate cut mask accordingly defines locations of a number of first dummy gate regions 212 and a number of first gate cut regions 214, alternating the first dummy gate regions 212. The first dummy gate regions 212 and the first gate cut regions 214 are defined along the first dummy gate track TD1. The gate cut mask further defines locations of a number of second dummy gate regions 222 and a number of second gate cut regions 224, alternating the second dummy gate regions 222. The second dummy gate regions 222 and the second gate cut regions 224 are defined along the second dummy gate track TD2.

Each first dummy gate region 212 extends across a respective first subset 12 of the active semiconductor patterns 10 and each first cut region 214 extends across a respective second subset 14 of the active semiconductor patterns 10. Each second dummy gate region 222 extends across a respective one of the second subsets 14 of the active semiconductor patterns 10 and each second cut region 222 extends across a respective one of the first subsets 12 of the active semiconductor patterns 10.

The gate cut mask may comprise a photoresist layer with lithographically defined openings defining the locations of the gate cut regions 214, 224. The gate cut mask may also be a lithographic mask layer stack (a "litho stack"), comprising in a bottom-up-direction for instance a patterning layer (e.g. an organic or non-organic patterning film), one or more transfer layers (e.g. anti-reflective coatings such as SiOC layers or spin-on-glass layers, and a planarization layer such as a spin-on-carbon layer), and a photoresist layer. Openings may be lithographically defined in the photoresist layer and subsequently transferred into lower layers of the litho stack, in a number of etch steps, and subsequently into the patterning layer. The openings may thereafter be transferred from the patterning layer into the gate structures.

In FIG. 3, the openings in the gate cut mask have been transferred into the gate structures, thereby forming a first dummy gate pattern 210 comprising an interrupted dummy gate structure comprising a number of dummy gate structure parts in the first dummy gate regions 212, and separated by gaps (i.e. absence of dummy gate structure parts) in the first gate cut regions 214. Correspondingly, a second dummy gate pattern 220 comprising an interrupted dummy gate structure comprising a number of dummy gate structure parts in the second dummy gate regions 222, and separated by gaps (i.e. absence of dummy gate structure parts) in the second gate cut regions 224.

Comparing FIG. 2 and FIG. 3 indicates that the preliminary active gate pattern 110' is unaffected by the cut process and is thus substantially identical to the active gate pattern 110. However, in principle, it is possible to cut away portions of also the preliminary active gate pattern 110' if a gate interruption along the active gate track would be desirable.

The gate cuts may be formed by etching through the openings in the gate cut mask using one or more wet and/or dry etching processes selected in accordance with the gate structure composition (e.g. metal gate electrode or sacrificial polysilicon gate). The gate cut formation may further comprise etching through gate caps and/or gate spacers, if such are present. It should be noted that the method presents a general applicability to various approaches for forming gate cuts. Gate cutting may for instance be implemented by block techniques, wherein the gate patterns comprising interrupted gate structures, as shown in FIG. 3, may be formed directly. In such approaches, the set of gate patterns 110, comprising the first and second dummy gate patterns 210, 220 may be directly formed without relying on any preceding formation of preliminary gate patterns 110'.

Subsequent to forming the gate cuts, the fins 10 are subjected to a doping process. The doping process is schematically indicated by "D" in FIG. 3.

If the fins 10 initially were doped with a first type of dopant, a second type of dopant, opposite to the first type of dopant may be used. For instance, if an n-type FET device is to be formed, the process D may introduce n-type dopants into the fins 10. Conversely, if a p-type FET device is to be formed, the process P may introduce p-type dopants into the fins 10.

During the doping process, the presence of the gate structures of the gate patterns will counteract doping in fin portions covered by the gate structures. More specifically, and with reference to the drain-side region 20, the dummy gates present in the first and second dummy gate regions 212, 222 will counteract doping in portions of the fins of the first subset 12 and the second subset 14, respectively, located under the dummy gates. The masked fin portions may accordingly remain un-doped or doped with the first type of dopant, as the case may be. Meanwhile, due to the first and second dummy gate cut regions 214, 224 the first and second dummy gate patterns 210, 220 will allow doping of portions of the fins of the second subset 14 and the first subset 12, respectively, extending through the dummy gate cut regions 214, 224.

The doping process may involve any applicable doping techniques such as doping by ion implantation and/or epitaxial growth of in-situ doped semiconductor material on exposed fin portions 10. By way of example, the fin portions masked by dummy gates may be un-doped or have a doping concentration of about $1E17$ atoms/cm$^3$ or lower, for instance in the range of $1E15$ to $1E17$ atoms/cm$^3$. Meanwhile, un-masked fin portions may be doped to a doping concentration of about $1E20$ atoms/cm$^3$ or higher, e.g. to enable a good ohmic contact between the semiconductor material and metal contacts, described below.

The doping process may typically be applied to the entire drain-side region 20 and source-side region 30 simultaneously. However, this is not strictly a requirement but doping of the source-side region and the drain-side region may be performed in separate steps if desired. As may be appreciated from the above, during doping of the drain-side region and/or the source-side region, the active dummy gate pattern 110 may counteract doping in fin portions covered by the gate structure(s) of the active dummy gate pattern 110, thereby defining an n-type or p-type channel of a FET along each fin 10.

Figure 4:
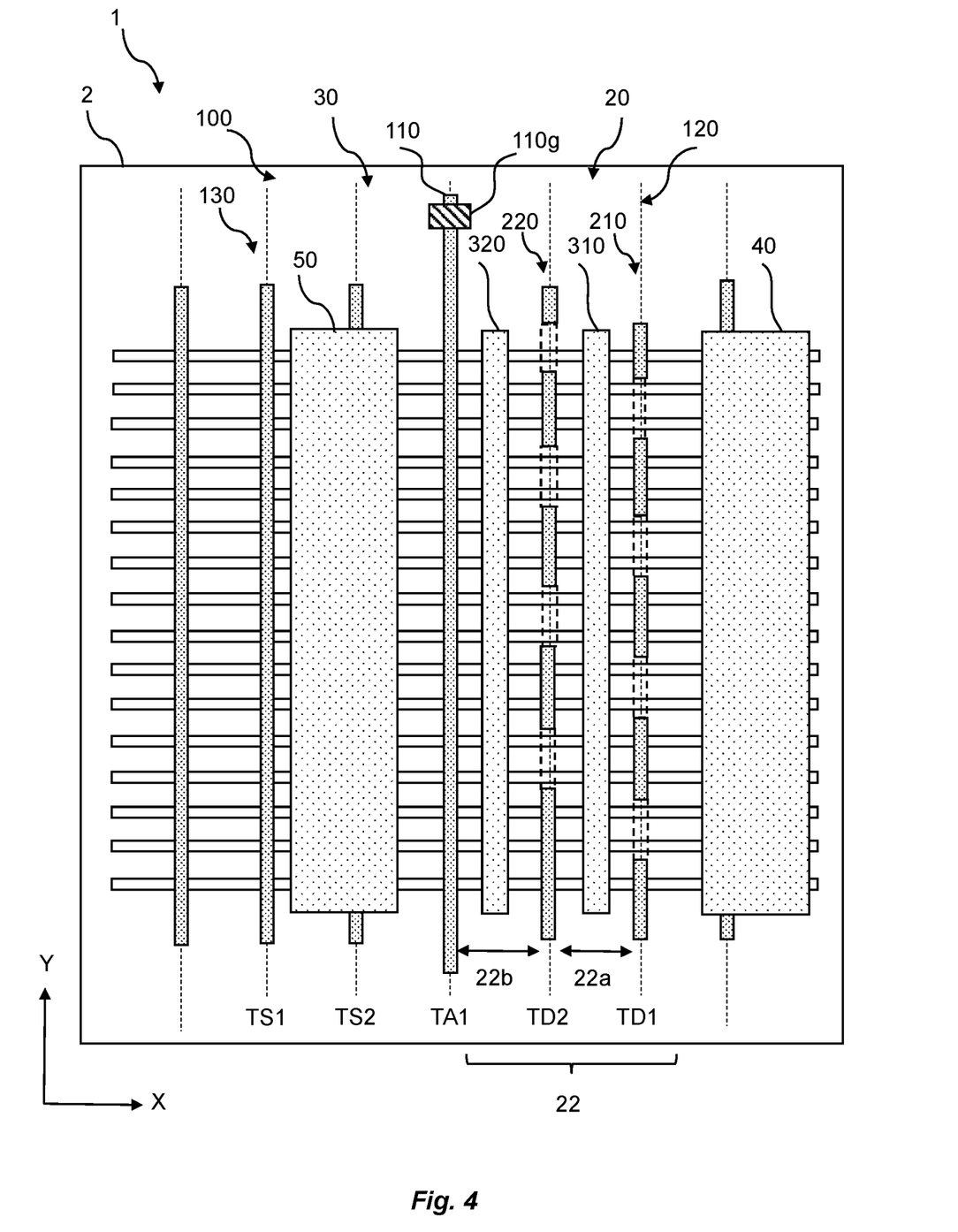
FIG. 4 schematically illustrates a method for forming a semiconductor device comprising a ballast region, according to an example embodiment.

In FIG. 4, subsequent to the doping process D, a metal interconnect structure 310 has been formed in the drain ballast region 22, at a position between the first and the second dummy gate patterns 210, 220. The metal interconnect structure 310 is configured to connect each of the fins of the second subset 14 to one or more of the fins of the first subset 12. The electrical interconnection is formed between fin portions located in the region 22a between first and the second dummy gate patterns 210, 220.

As will be described below with reference to FIG. 5, the metal interconnect structure 310 may comprise a set of metal contacts/vertical vias formed on the fin portions 10 located in the region 22a between the first and the second dummy gate patterns 210, 220. The metal interconnect structure 310 may further comprise a metal interconnect layer abutting an upper portion of the metal contacts. The metal interconnect structure may accordingly provide a low-resistance circuitous current path extending between the fins of the second subset 14 and fins of the first subset 12. It is also possible to form the interconnect structure as an elongated contact, extending across the fins to straddle the fin portions.

A second metal interconnect structure 320 has also been formed in the drain ballast region 22, at a position between the second dummy gate pattern 220 and the active gate pattern 110. The metal interconnect structure 320 is configured to connect each of the fins of the first subset 12 to one or more of the fins of the second subset 14. The electrical interconnection is formed between fin portions located in the region 22b between the second dummy gate pattern 220 and the active gate pattern 110. The second metal interconnect structure 320 may have a similar structure as the first interconnect structure 310, e.g. comprising vias and metal layers.

Further a metal drain contact 40 has been formed in the drain-side region 20. The metal drain contact 40 may be formed in contact with drain-side contact portions of each one of the fins 10. The metal drain contact 40 may have a similar structure as the first interconnect structure 310, as discussed above, e.g. comprising vias and metal layers. Forming the metal drain contact 40 as suggested in FIG. 4, i.e. as a continuous structure in contact with each of the fins 10, may represent a convenient option process-wise. However, due to the presence of the dummy gates on the second subset of fins 14 along the first dummy gate track TD1, it is sufficient to form the metal drain contact to abut the first subset of fins 12.

As shown in FIG. 4, a corresponding metal source drain contact 50 may be formed in the source-side region 30. The metal source contact 50 may be formed in contact with source-side contact portions of each one of the fins 10. The metal source contact 50 may have a similar structure as the metal drain contact 40.

The metal interconnect structures 310, 320 as well as the metal drain contact 40 and metal source contact 50 may be fabricated in parallel, e.g. by covering the fins 10 in a dielectric layer (such as a pre-metal dielectric composed of a low-k material), patterning contact apertures and contact trenches in the dielectric layer and filling the apertures and contacts with one or more metal contact layers, reminiscent of a dual damascene flow. However, the contact formation and metal layer formation may also be performed in two consecutive process steps. A further option could be to deposit one metal contact layer and subsequently patterning the same to form the separate interconnect and drain contact structures by metal etching.

In case a gate-last approach is employed, the sacrificial gate structures of the set of gate patterns may subsequently be replaced by metal (active and dummy) gate electrodes prior or subsequent to forming the interconnect structures 310, 320 and the drain contact 40. The gate-last technique is also known as a replacement metal gate process.

FIG. 4 depicts the structure of the device 1 comprising the drain-ballast region 22 with the dummy gate patterns 210, 220 and the first and second metal interconnect structures 310, 320 arranged between the drain contact 40 and the active dummy gate pattern 110. Additionally, a gate contact 110g has been formed on and in contact with a gate electrode of the active gate pattern 110. The gate contact 110g may be coupled to a metal line in an interconnect structure, configured to supply gate voltages to the active gate during use of the device.

In FIG. 4, the ballast region 22 is defined to comprise two dummy gate patterns 210, 220, however the principle may easily be extended to comprise three, four or more dummy gate patterns. A metal interconnect structure, corresponding to the above discussed first and second metal interconnect structures 310, 320 may be formed between each adjacent pair of dummy gate patterns. Denoting metal drain contact "DC", metal interconnect structure "MI", dummy gate pattern "DG" and active gate pattern "AG", a drain ballast region 22 may for instance comprise: DC/DG1/MI1/DG2/MI2/DG3/MI3/AG; or DC/DG1/MI1/DG2/MI2/DG3/MI3/ . . . /DG$<n>$/MI$<n>$/AG (where n is 4 or greater).

FIGS. 5-8 show example current flows in the drain-side region of the device 1, for various designs of drain-ballast regions 22.

Figure 5:
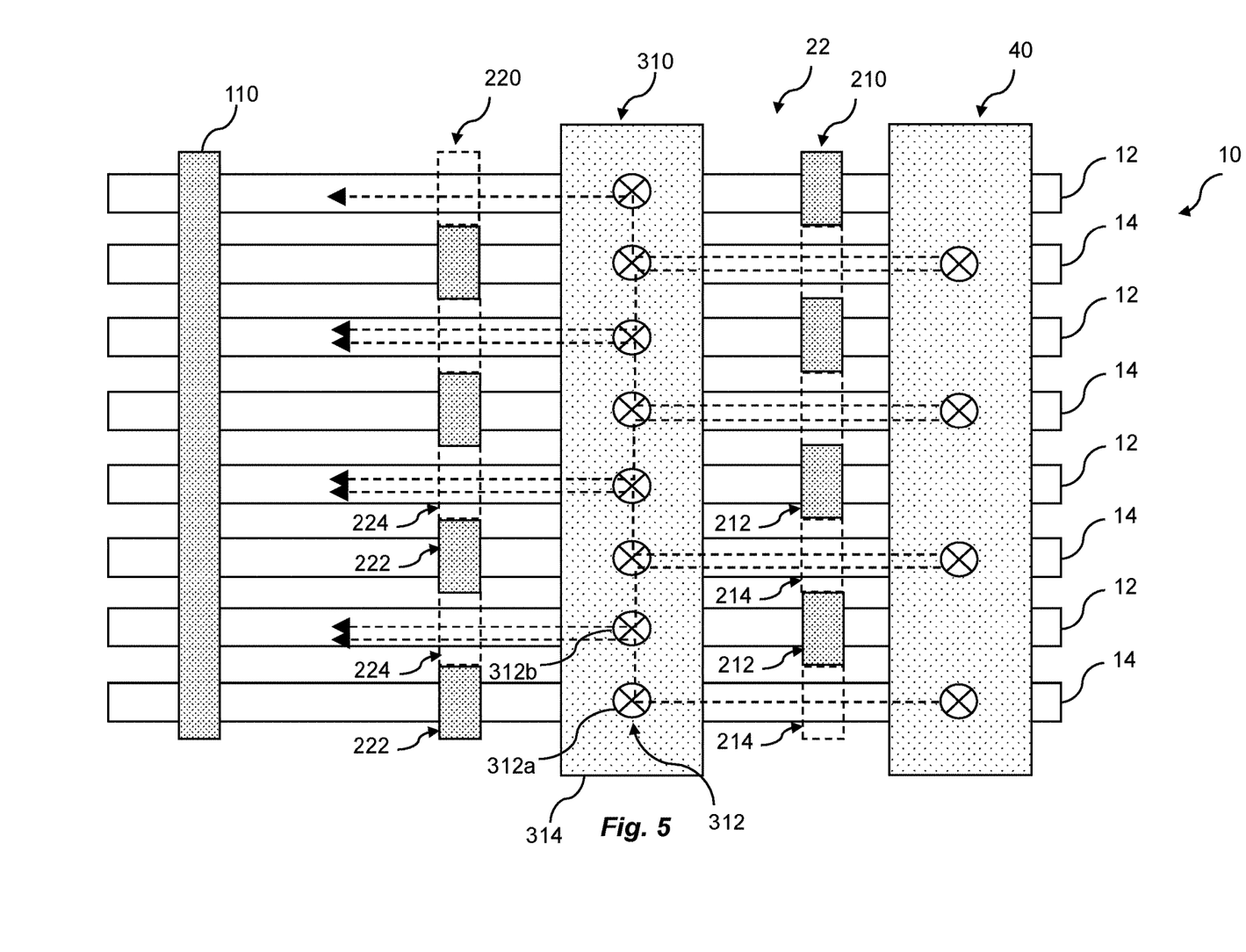
FIG. 5 schematically illustrates a design of a drain ballast region, according to an example embodiment.
Figure 6:
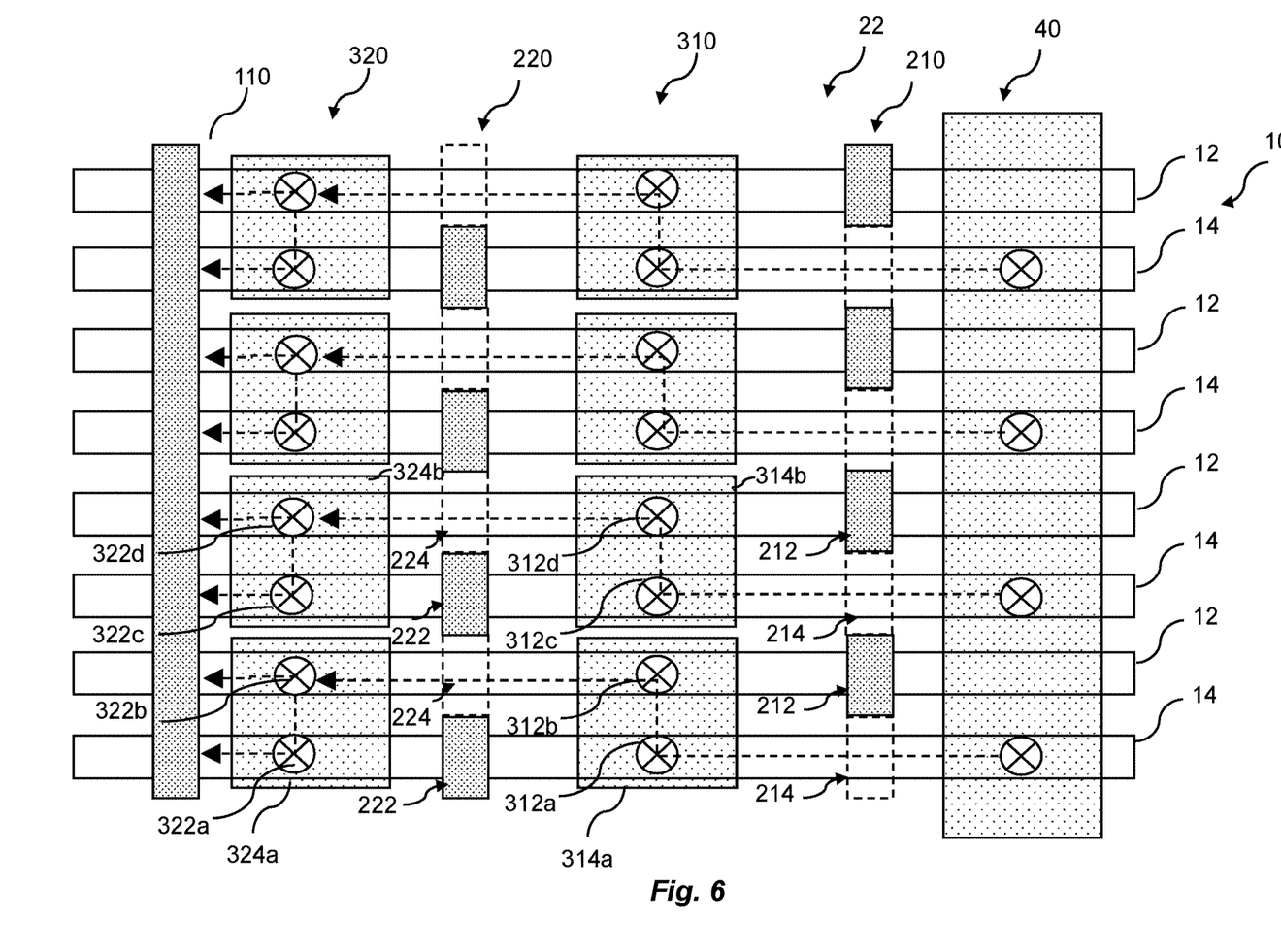
FIG. 6 schematically illustrates a design of a drain ballast region, according to an example embodiment.

In FIG. 5 the drain ballast region 22 comprises a single metal interconnect structure 310. Accordingly, only half of the fins 10 will be used under the active gate pattern 110. As shown, the metal interconnect structure 310 may comprise a set of vertical metal contacts 312, for instance contacts 312a and 312b. A continuous metal interconnect layer 314 is formed on top of the contacts 312. FIG. 6 further illustrates the possibility that each subset of fins 12, 14 may comprise a single fin.

In FIG. 6 the drain ballast region 22 comprises a first and a second metal interconnect structure 310, 320. Each of the structures 310, 320 comprises a number of separate metal layer parts 314a, 314b and 324a, 324b each formed on respective subsets 312a, 312b and 312c, 312d, and 322a, 322b and 322c, 322d of the metal contacts.

Figure 7:
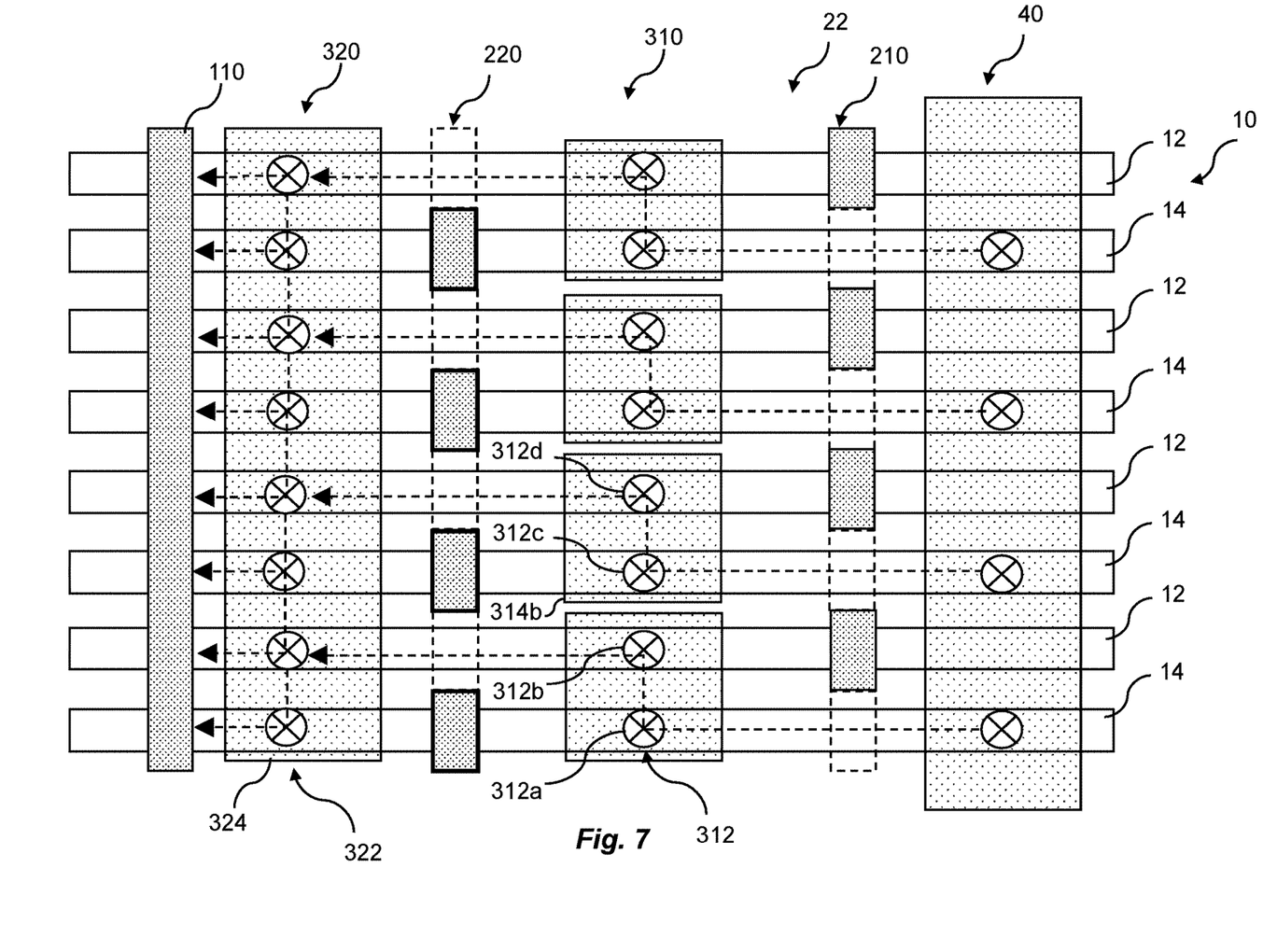
FIG. 7 schematically illustrates a design of a drain ballast region, according to an example embodiment.

The drain ballast region 22 in FIG. 7 is similar to the region 22 of FIG. 6 but differs in that the second interconnect structure 320 comprises a set of vertical metal contacts 322 and a continuous metal interconnect layer 324 formed on top of the contacts 322.

Figure 8:
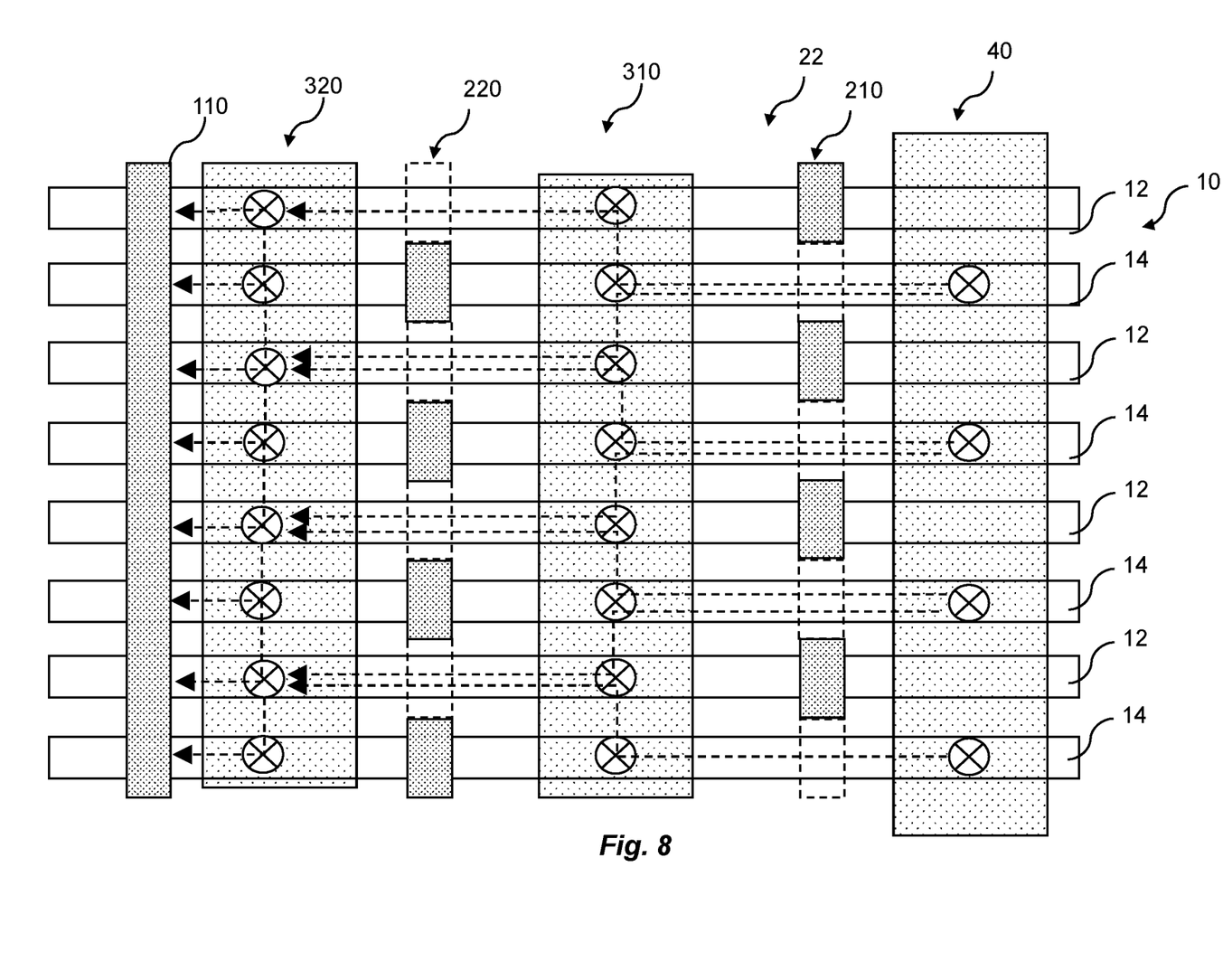
FIG. 8 schematically illustrates a design of a drain ballast region, according to an example embodiment.

The drain ballast region 22 in FIG. 8 is similar to the region 22 of FIG. 7 but differs in that also the first interconnect structure 310 comprises a set of vertical metal contacts 312 and a continuous metal interconnect layer 314 formed on top of the contacts 312.

In each of FIGS. 5-8, the dashed arrows schematically indicate (the lower resistance) conduction paths extending from the drain contact 40 to the active gate pattern 110 (and thereafter to the source-side). As may be seen, the current paths circumvent the higher resistance fin portions 10 located in the dummy gate regions 212, 222 by changing to an adjacent fin via the interconnect structure 310.

In the above embodiments have mainly been described with reference to a limited number of examples. However, as is readily appreciated by a person skilled in the art, other examples than the ones disclosed above are equally possible within the scope of the embodiments described herein, as defined by the appended claims While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for forming a semiconductor device, the method comprising:
   forming, on a substrate, a set of parallel gate patterns across a plurality of parallel active semiconductor patterns that extend along the substrate, the set of gate patterns comprising: an active gate pattern formed between a drain-side region and a source-side region, a first dummy gate pattern, and a second dummy gate pattern;

forming a metal drain contact in the drain-side region, wherein the first and second dummy gate patterns are formed in a ballast region that is located in the drain-side region between the metal drain contact and the active gate pattern, wherein the first dummy gate pattern comprises a number of first dummy gate regions that define respective dummy gates and a number of first gate cut regions that alternate with the first dummy gate regions and in which a dummy gate is absent, wherein each first dummy gate region extends across a respective first subset of the active semiconductor patterns and each first gate cut region extends across a respective second subset of the active semiconductor patterns, and wherein the second dummy gate pattern is formed between the first dummy gate pattern and the active gate pattern and comprises a number of second dummy gate regions that define respective dummy gates and a number of second gate cut regions that alternate with the second dummy gate regions and in which a dummy gate is absent, wherein each second dummy gate region extends across a respective one of the second subsets of the active semiconductor patterns and each second gate cut region extends across a respective one of the first subsets of the active semiconductor patterns;

wherein the method further comprises doping the active semiconductor patterns in the drain-side region with a first type of dopant while using the first and second dummy gate patterns as a mask to counteract doping of the active semiconductor patterns with the first type of dopant in the first and second dummy gate regions; and forming a first metal interconnect structure connecting each of the active semiconductor patterns of the second subset to a respective at least one of the active semiconductor patterns of the first subset in a region between the first and the second dummy gate patterns.

2. The method according to claim 1, wherein the first metal interconnect structure connects each of the active semiconductor patterns of the second subset to a respective active semiconductor pattern of the first subset.

3. The method according to claim 1, wherein forming the first metal interconnect structure comprises forming:
a set of metal contacts on the active semiconductor patterns in the region between the first and the second dummy gate patterns, and
a metal interconnect layer on the metal contacts.

4. The method according to claim 1, further comprising:
forming a second metal interconnect structure connecting each of the active semiconductor patterns of the first subset to a respective at least one of the active semiconductor patterns of the second subset in a region between the second dummy gate pattern and the active gate pattern.

5. The method according to claim 4, wherein the second metal interconnect structure connects each of the active semiconductor patterns of the first subset to a respective active semiconductor pattern of the second subset.

6. The method according to claim 1, wherein the set of gate patterns further comprises a third parallel dummy gate pattern formed in the drain-side region, wherein the second dummy gate pattern is formed between the first and the third dummy gate pattern, and wherein the third dummy gate pattern comprises a number of third dummy gate regions that define respective dummy gates and a number of third gate cut regions in which a dummy gate is absent and that alternate with the third dummy gate regions, wherein each third dummy gate region extends across a respective one of the first subsets of the active semiconductor patterns and each third gate cut region extends across a respective one of the second subsets of the active semiconductor patterns.

7. The method according to claim 1, wherein each one of the first subsets of the active semiconductor patterns comprises one or more active semiconductor patterns and each one of the second subsets of the active semiconductor patterns comprises one or more active semiconductor patterns.

8. The method according to claim 1, wherein the metal drain contact is connected to drain-side contact portions of the active semiconductor patterns of at least one of the first subset or the second subset.

9. The method according to claim 1, wherein each active semiconductor pattern comprises an elongated semiconductor body that protrudes above the substrate.

10. The method according to claim 1, wherein the active semiconductor patterns are un-doped prior to doping the active semiconductor patterns in the drain-side region with the first type of dopant.

11. The method according to claim 1, wherein the active semiconductor patterns are doped with a second type of dopant prior to doping the active semiconductor patterns in the drain-side region with the first type of dopant.

12. A semiconductor device comprising:
a substrate;
a plurality of parallel active semiconductor patterns that extend along the substrate through a drain-side region and a source-side region;
a metal drain contact that is located in the drain-side region; and
a set of parallel gate patterns extending across the active semiconductor patterns, the set of parallel gate patterns comprising an active gate pattern, a first dummy gate pattern, and a second dummy gate pattern,
wherein the active gate pattern is arranged between the drain-side region and the source-side region and the first and second dummy gate patterns are arranged in a ballast region that is located in the drain-side region between the metal drain contact and the active gate pattern,
wherein the first dummy gate pattern defines a number of first dummy gate regions that define respective dummy gates and a number of first gate cut regions that alternate with the first dummy gate regions and in which a dummy gate is absent, wherein each first dummy gate region extends across a respective first subset of the active semiconductor patterns and each first cut region extends across a respective second subset of the active semiconductor patterns,
wherein the second dummy gate pattern is arranged between the first dummy gate pattern and the active gate pattern and defines a number of second dummy gate regions that define respective dummy gates and a number of second gate cut regions that alternate with the second dummy gate regions and in which a dummy gate is absent, wherein each second dummy gate region extends across a respective one of the second subsets of the active semiconductor patterns and each second cut region extends across a respective one of the first subsets of the active semiconductor patterns, and
wherein the active semiconductor patterns are doped with a first type of dopant in portions exposed by the first and second dummy gates in the first and second dummy gate regions, the exposed regions comprising the first and second gate cut regions of the first and second dummy gate patterns;

the device further comprising a first metal interconnect structure that connects each of the active semiconductor patterns of the second subset to a respective at least one of the active semiconductor patterns of the first subset in a region between the first and the second dummy gate patterns.

13. The device according to claim 12, wherein the first metal interconnect structure connects each of the active semiconductor patterns of the second subset to a respective active semiconductor pattern of the first subset.

14. The device according to claim 12, wherein the first metal interconnect structure comprises:

a set of metal contacts arranged on the active semiconductor patterns in the region between the first and the second dummy gate patterns, and a metal interconnect layer arranged on the metal contacts.

15. The device according to claim 12, further comprising a second metal interconnect structure that connects each of the active semiconductor patterns of the first subset to a respective at least one of the active semiconductor patterns of the second subset in a region between the second dummy gate pattern and the active gate pattern.

16. The device according to claim 15, wherein the second metal interconnect structure connects each of the active semiconductor patterns of the first subset to a respective active semiconductor pattern of the second subset.

17. The device according to claim 12, wherein each active semiconductor pattern comprises an elongated semiconductor body that protrudes above the substrate.

18. The device according to claim 12, wherein the active semiconductor patterns are also doped with a second type of dopant.

19. The device according to claim 12, wherein each one of the first subsets of the active semiconductor patterns comprises one or more active semiconductor patterns and each one of the second subsets of the active semiconductor patterns comprises one or more active semiconductor patterns.

20. The device according to claim 12, wherein the metal drain contact is connected to drain-side contact portions of the active semiconductor patterns of at least one of the first subset or the second subset.

* * * * *